US006759262B2

(12) United States Patent
Theil et al.

(10) Patent No.: US 6,759,262 B2
(45) Date of Patent: Jul. 6, 2004

(54) IMAGE SENSOR WITH PIXEL ISOLATION SYSTEM AND MANUFACTURING METHOD THEREFOR

(75) Inventors: Jeremy A. Theil, Mountain View, CA (US); Dietrich W. Vook, Menlo Park, CA (US); Homayoon Haddad, Beaverton, OR (US)

(73) Assignee: Agilent Technologies, Inc., Palo Alto, CA (US)

( * ) Notice: Subject to any disclaimer, the term of this patent is extended or adjusted under 35 U.S.C. 154(b) by 140 days.

(21) Appl. No.: 10/032,023

(22) Filed: Dec. 18, 2001

(65) Prior Publication Data

US 2003/0111704 A1 Jun. 19, 2003

(51) Int. Cl.[7] .................................................. H01L 21/00

(52) U.S. Cl. ......................... 438/48; 438/325; 257/444; 257/458; 257/459; 257/656

(58) Field of Search ................................ 257/444, 446, 257/448, 458, 459, 461, 656, 657; 438/16, 48, 325, 328, 467

(56) References Cited

U.S. PATENT DOCUMENTS

| | | | |
|---|---|---|---|
| 5,936,261 | A | 8/1999 | Ma et al. |
| 6,018,187 | A | 1/2000 | Theil et al. |
| 2002/0171083 | A1 * | 11/2002 | Lim et al. |

* cited by examiner

*Primary Examiner*—W. David Coleman
*Assistant Examiner*—Khiem Nguyen

(57) ABSTRACT

An image sensor and method of manufacture therefor includes a substrate having pixel control circuitry. Dielectric layers on the substrate include interconnects in contact with the pixel control circuitry and with pixel electrodes. An intrinsic layer is over the pixel electrodes and has a gap provided between the pixel electrodes. An intrinsic-layer covering layer is over the intrinsic layer and a transparent contact layer over the intrinsic-layer covering and the interconnects. The intrinsic, intrinsic-layer covering, and transparent contact layer interact in different combinations to provide a pixel isolation system for the image sensor.

20 Claims, 4 Drawing Sheets

IMAGE SENSOR WITH PIXEL ISOLATION SYSTEM AND MANUFACTURING METHOD THEREFOR

BACKGROUND OF THE INVENTION

1. Technical Field

The present invention relates generally to image capture apparatus and more particularly to pixel array devices in such apparatus.

2. Background Art

Image capture apparatus, such as digital still and moving picture cameras, rely on image sensors. The image capture apparatus contains an array of image sensors, or light sensitive devices, detect the intensity of light received from the image. Each image sensor typically generates electronic signals that have amplitudes that are proportionate to the intensity of the light received by the image sensors. The image sensors can convert an optical image into a set of electronic signals. The electronic signals may also represent intensities of colors of light received by the image sensors. The electronic signals can be conditioned and sampled to allow image processing to provide an electronic version of the image.

Integration of the image sensors with signal processing circuitry is becoming more important because integration enables miniaturization and simplification of imaging systems. Integration of image sensors along with analog and digital signal processing circuitry allows electronic imaging systems to be low cost, compact and require low power consumption.

Historically, image sensors have predominantly been charged coupled devices (CCDs). CCDs are relatively small and can provide a high-fill factor. However, CCDs are very difficult to integrate with digital and analog circuitry. Further, CCDs dissipate large amounts of power and suffer from image smearing problems.

An alternative to CCD sensors is active pixel sensors. Active pixel sensors, such as photodiodes, can be fabricated using standard semiconductor CMOS processes. Therefore, active pixel sensors can easily be integrated with digital and analog signal processing circuitry. Further, CMOS circuits dissipate small amounts of power. One disadvantage to CMOS active pixel sensors is that the design must always be optimized among competing requirements of minimizing pixel area, maximizing photodiode collector sensitivity, and maximizing spacing of CMOS circuitry.

To overcome the above disadvantage, elevated active pixel sensors have been developed where the pixel sensors are elevated above the signal processing circuitry on the semiconductor wafer and connected by several levels of interconnect.

However, to avoid cross talk or interference between detected or generated signals within an array of elevated active pixel sensors, it is sometimes necessary to electrically isolate the pixel sensors from one another. Methods that have been proposed to isolate the pixel sensors include etching formed devices and depositing insulating films. Unfortunately, these methods resulted in the pixel sensors being exposed during processing and leakage paths forming through the intrinsic layer, or i-layer, between the pixel sensors, which resulted in increased noise. In addition, forming the insulating films increased process complexity, which added to manufacturing cost.

Solutions to these problems have been long sought, but have long eluded those skilled in the art.

DISCLOSURE OF THE INVENTION

The present invention provides an image sensor and method of manufacture therefor includes a substrate having pixel control circuitry. Dielectric layers on the substrate include interconnects in contact with the pixel control circuitry and with pixel electrodes. An intrinsic layer is over the pixel electrodes and has a gap provided between the pixel electrodes. An intrinsic-layer covering layer is over the intrinsic layer and a transparent contact layer over the intrinsic-layer covering and the interconnects. The intrinsic, intrinsic-layer covering, and transparent contact layer interact in different combinations to provide a pixel isolation system for the image sensor.

An advantage of the present invention is that the intrinsic layer is fully enclosed, and would minimize or eliminate leakage paths through the intrinsic layer that existed in the prior art.

An additional advantage is that the present invention does not require dielectric isolation. In fact, some embodiments would not require any additional masks.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
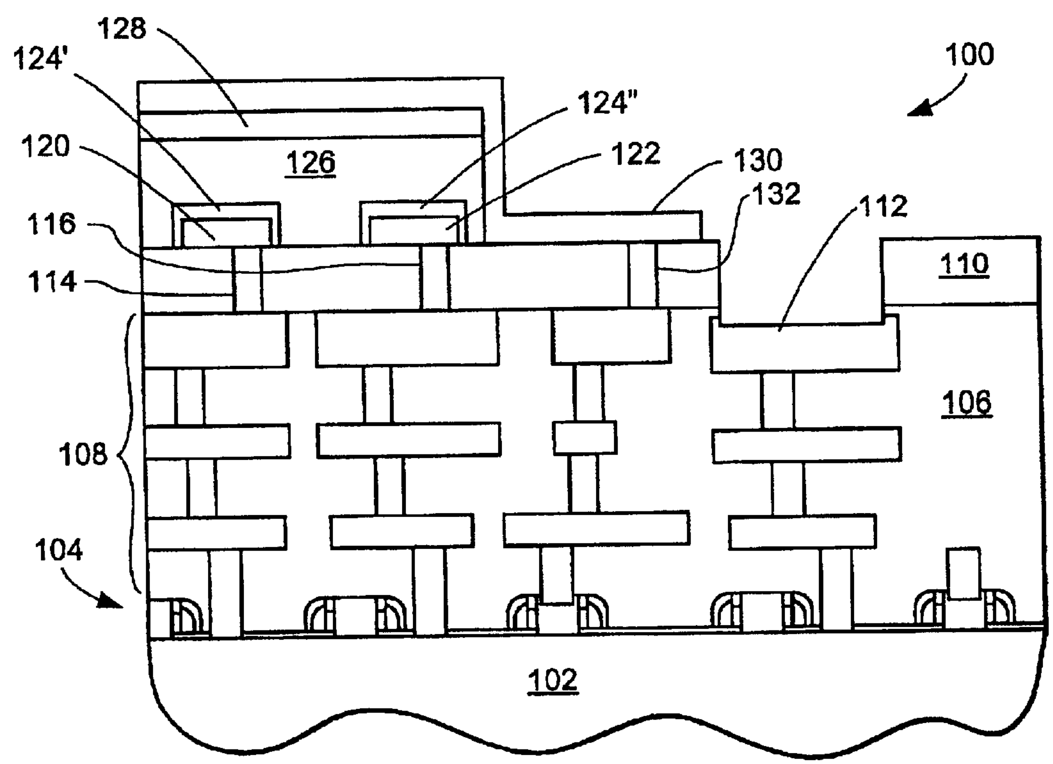
FIG. 1 (PRIOR ART) is a side view of a prior art image sensor.

Referring now to FIG. 1 (PRIOR ART), therein is shown a prior art image sensor 100. The image sensor 100 includes a semiconductor substrate 102 having a plurality of transistors configured to form pixel control circuitry 104. Above and surrounding the pixel control circuitry 104 are a plurality of layers of dielectric material forming a dielectric layer 106. The dielectric layer 106 contains a plurality of metal interconnects 108.

The term "horizontal" as used herein is defined as a plane parallel to the conventional plane or surface of a semiconductor wafer of which the substrate is a part, regardless of the orientation of the semiconductor wafer. The term "vertical" refers to a direction perpendicular to the horizontal as just defined. Terms, such as "on", "above", "below", "higher", "lower", "over", and "under", are defined with respect to the horizontal.

A top capping layer 110 is disposed above the dielectric layer 106. The top capping layer 110 has an opening provided therein to expose a bonding pad 112 for making an exterior connection to packaging (not shown), which surrounds the image sensor 100. The top capping layer 110 further includes first and second bottom pixel contacts 114 and 116, which are connected by the plurality of metal interconnects 108 to the pixel control circuitry 104.

The first and second bottom pixel contacts 114 and 116 are respectively connected to first and second pixel electrodes 120 and 122. The first and second pixel electrodes 120 and 122 are each coated by a pixel covering layer, which typically is an n-doped material. The n-doped layer is formed into first and second n-doped layer portions 124' and 124". The first and second n-doped layer portions 124' and 124" are both covered by an intrinsic layer, or i-layer 126. Above the i-layer 126 is a i-layer covering layer, such as a p-doped layer 128.

A transparent contact layer 130 is formed over the p-doped layer 128, the i-layer 126, and the top capping layer 110. The transparent contact layer 130 is connected to the pixel control circuitry 104 through a via contact 132.

The first pixel consists of the first pixel electrode 120, the n-doped layer 124, the i-layer 126, and the p-doped layer 128. The second pixel is made up of the second pixel electrode 122, the n-doped layer 124, the i-layer 126, and the p-doped layer 128. Where the pixel covering material is n-doped, and the i-layer covering layer is p-doped, the first and second photosensors are p-doped, intrinsic layer, n-doped (PIN) diodes.

Figure 2:
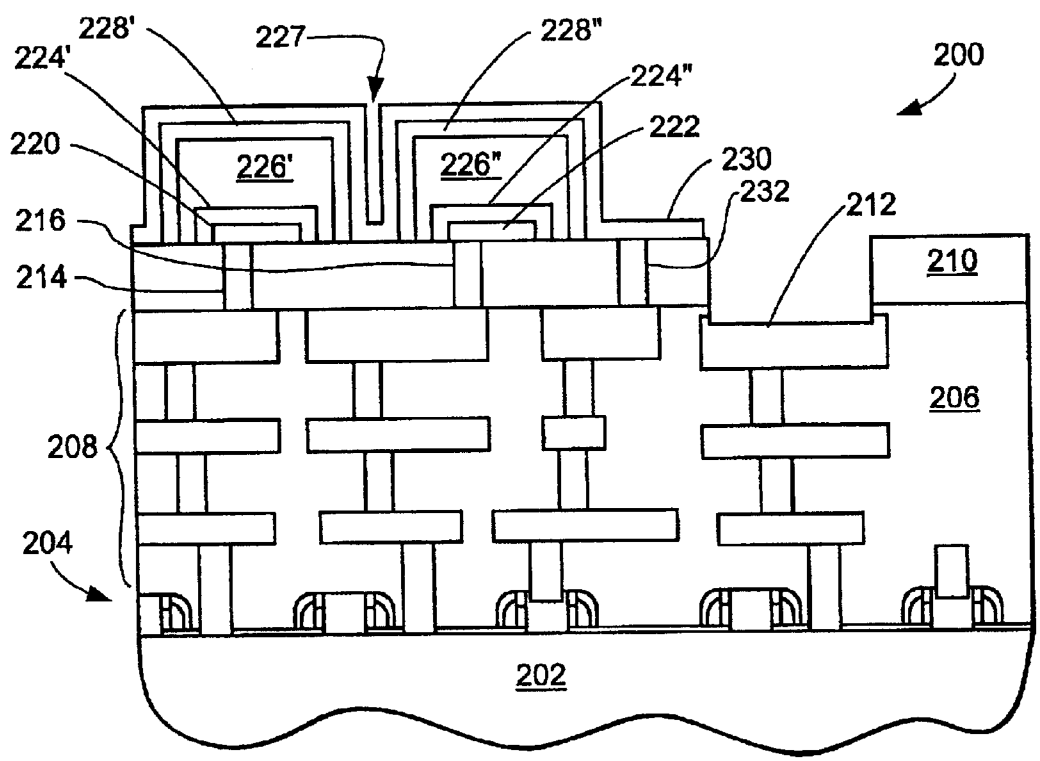
FIG. 2 is a side view of a first image sensor in accordance with the present invention.

Referring now to FIG. 2, therein is shown a first image sensor 200 according to the present invention. The first image sensor 200 includes a semiconductor substrate 202 having a plurality of CMOS transistors configured to form pixel control circuitry 204. The semiconductor substrate 202 can be of any semiconductor material, including silicon, gallium arsenide, indium phosphide or other Group II–VI or Group III–V materials. The semiconductor substrate 202 can be processed to form devices in CMOS (complementary metal oxide silicon), BiCMOS, Bipolar, or any other integrated circuit technology. Above and surrounding the pixel control circuitry 204 are a plurality of layers of dielectric material forming a dielectric layer 206. The dielectric layer 206 contains a plurality of metal interconnects 208.

A top capping layer 210 is disposed above the dielectric layer 206. The top capping layer 210 has an opening provided therein to expose a bonding pad 212 for making an exterior connection to packaging (not shown), which surrounds the image sensor 200. The top capping layer 210 further includes first and second bottom pixel contacts 214 and 216.

The first and second bottom pixel contacts 214 and 216 are respectively connected to first and second pixel electrodes 220 and 222, which are typically of conductively doped semiconductor materials. The first and second pixel electrodes 220 and 222 are each coated by a pixel covering layer, which typically is an n-doped material. The pixel covering layer is formed into first and second n-doped layer portions 224' and 224" respectively over the first and second pixel electrodes 220 and 222. The first and second n-doped layer portions 224' and 224" are each covered by an intrinsic layer, or i-layer, which is formed into first and second i-layer portions 226' and 226" separated by a gap 227. Above the first and second i-layer portions 226' and 226" is an i-layer covering layer, which is typically a p-doped material, formed into respective first and second p-doped layer portions 228' and 228".

A transparent contact layer 230 is deposited over the first and second p-doped layer portions 228' and 228" and the top capping layer 210. The transparent contact layer 230 is connected to the pixel control circuitry 204 through a via contact 232 and the plurality of metal interconnects 208.

The first pixel consists of the first pixel electrode 220, the first n-doped layer portion 224', the first i-layer portion 226', and the first p-doped layer portion 228'. The second pixel is made up of the second pixel electrode 222, the second n-doped layer portion 224", the second i-layer portion 226", and the second p-doped layer portion 228". The first and second pixels are PIN diodes.

The gap 227, the first and second n-doped layer portions 224' and 224", the first and second i-layer portions 226' and 226", the first and second p-doped layer portions 228' and 228", and the transparent contact layer 230 separate the first and second pixel electrodes 220 and 222 so as to prevent leakage current therebetween.

The present invention is exemplified by PIN diode active pixel sensors, but it will be evident to those having ordinary skill in the art that the present invention is also applicable to NIP diode active pixel sensors where the p-doped and n-doped layers are interchanged.

Similarly, the present invention is applicable to Schottky diode sensors. For example, the electrodes would be of conductive metal under an i-layer below a p-doped layer. In another example, the electrode would be of conductive metal, such as chromium, platinum, aluminum, or titanium, under an i-layer below a transparent conductive material, such as a transparent conductive metal or a transparent silicide. In a further example, the electrode would be of an n-doped layer under an i-layer below a transparent conductive metal or a transparent silicide.

Figure 3:
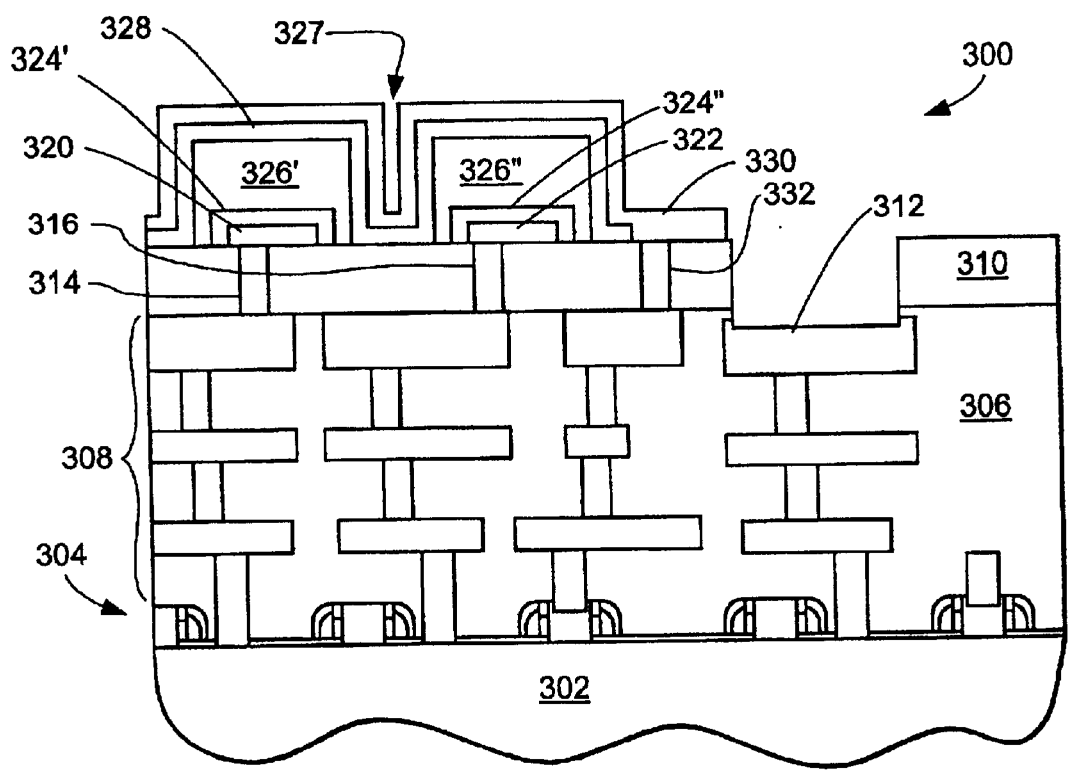
FIG. 3 is a side view of a second image sensor in accordance with the present invention.

Referring now to FIG. 3, therein is shown a second image sensor 300 according to the present invention. The second image sensor 300 includes a semiconductor substrate 302 having a plurality of transistors configured to form pixel control circuitry 304. Above and surrounding the pixel control circuitry 304 are a plurality of layers of dielectric material forming a dielectric layer 306. The dielectric layer 306 contains a plurality of metal interconnects 308.

A top capping layer 310 is disposed above the dielectric layer 306. The top capping layer 310 has an opening provided therein to expose a bonding pad 312 for making an exterior connection to packaging (not shown), which surrounds the second image sensor 300. The top capping layer 310 further includes first and second bottom pixel contacts 314 and 316.

The first and second bottom pixel contacts 314 and 316 are respectively connected to first and second pixel electrodes 320 and 322. The first and second pixel electrodes 320 and 322 are each coated by a pixel covering layer, which typically is an n-doped material. The pixel covering layer is formed into first and second n-doped layer portions 324' and 324" respectively over the first and second pixel electrodes 320 and 322. The first and second n-doped layer portions 324' and 324" are each covered by an intrinsic layer, or i-layer, which is formed into first and second i-layer portions 326' and 326" separated by a gap 327. Above the first and second i-layer portions 326' and 326" is an i-layer covering layer, which is typically a p-doped material, formed into a p-doped layer 328.

A transparent contact layer 330 is deposited over the p-doped layer 328 and the top capping layer 310. The transparent contact layer 330 is connected to the pixel control circuitry 304 through a via contact 332 and the plurality of metal interconnects 308.

The first pixel consists of the first pixel electrode 320, the first n-doped layer portion 324', the first i-layer portion 326', and the p-doped layer 328. The second pixel is made up of the second pixel electrode 322, the second n-doped layer portion 324", the second i-layer portion 326", and the p-doped layer 328. The first and second pixels are PIN diodes.

The gap 327, the first and second n-doped layer portions 324' and 324", the first and second i-layer portions 326' and 326", the p-doped layer 328, and the transparent contact layer 330 separate the first and second pixel electrodes 320 and 322 so as to prevent leakage current therebetween.

Figure 4:
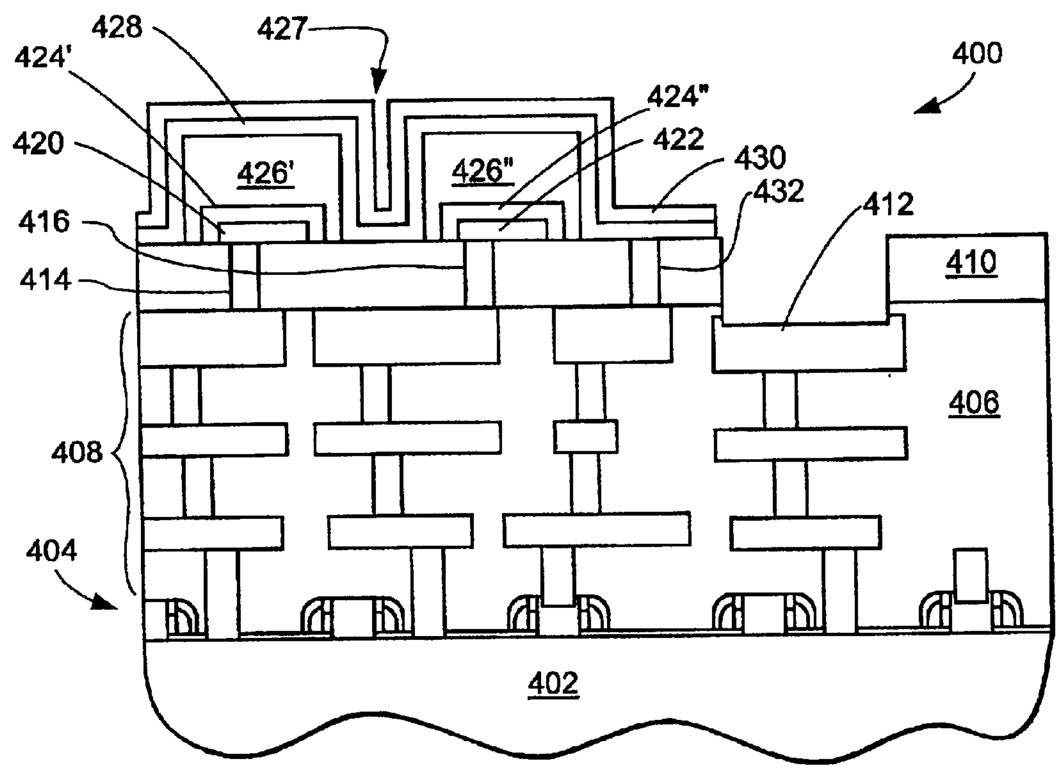
FIG. 4 is a side view of a third image sensor in accordance with the present invention.

Referring now to FIG. 4, therein is shown a third image sensor 400 according to the present invention. The third image sensor 400 includes a semiconductor substrate 402 having a plurality of transistors configured to form pixel control circuitry 404. Above and surrounding the pixel control circuitry 404 are a plurality of layers of dielectric material forming a dielectric layer 406. The dielectric layer 406 contains a plurality of metal interconnects 408.

A top capping layer 410 is disposed above the dielectric layer 406. The top capping layer 410 has an opening provided therein to expose a bonding pad 412 for making an exterior connection to packaging (not shown), which surrounds the third image sensor 400. The top capping layer 410 further includes first and second bottom pixel contacts 414 and 416.

The first and second bottom pixel contacts 414 and 416 are respectively connected to first and second pixel electrodes 420 and 422. The first and second pixel electrodes 420 and 422 are each coated by a pixel covering layer, which typically is an n-doped material. The pixel covering layer is formed into first and second n-doped layer portions 424' and 424" respectively over the first and second pixel electrodes 420 and 422. The first and second n-doped layer portions 424' and 424" are each covered by an intrinsic layer, or i-layer, which is formed into first and second i-layer portions 426' and 426" separated by a gap 427. Above the first and second i-layer portions 426' and 426" is a i-layer covering layer, which is typically a p-doped material, formed into a p-doped layer 428.

A transparent contact layer 430 is deposited over the p-doped layer 428. The transparent contact layer 430 is connected to the pixel control circuitry 404 through the p-doped layer 428, a via contact 432, and the plurality of metal interconnects 408.

The first pixel consists of the first pixel electrode 420, the first n-doped layer portion 424', the first i-layer portion 426', and the p-doped layer 428. The second pixel is made up of the second pixel electrode 422, the second n-doped layer portion 424", the second i-layer portion 426", and the p-doped layer 428. The first and second pixels are PIN diodes.

The gap 427, the first and second n-doped layer portions 424' and 424", the first and second i-layer portions 426' and 426", the p-doped layer 428, and the transparent contact layer 430 separate the first and second pixel electrodes 420 and 422 so as to prevent leakage current therebetween.

The advantage of the third image sensor 400 is that one mask step can be eliminated by leaving the p-doped layer 428 over the via contact 432. Since the p-doped layer 428 is conductive and thin, it will have minimal effect on the performance of the third image sensor 400.

Figure 5:
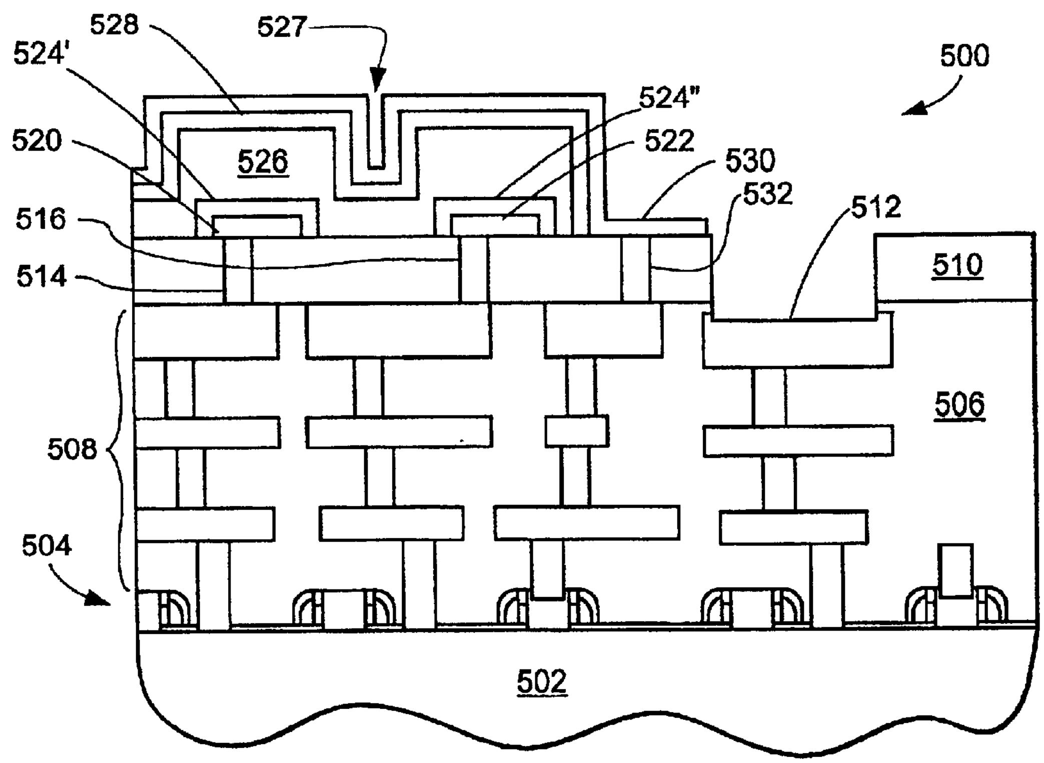
FIG. 5 is a side view of a fourth image sensor in accordance with the present invention.

Referring now to FIG. 5, therein is shown a fourth image sensor 500 according to the present invention. The fourth image sensor 500 includes a semiconductor substrate 502 having a plurality of transistors configured to form pixel control circuitry 504. Above and surrounding the pixel control circuitry 504 are a plurality of layers of dielectric material forming a dielectric layer 506. The dielectric layer 506 contains a plurality of metal interconnects 508.

A top capping layer 510 is disposed above the dielectric layer 506. The top capping layer 510 has an opening provided therein to expose a bonding pad 512 for making an exterior connection to packaging (not shown), which surrounds the fourth image sensor 500. The top capping layer 510 further includes first and second bottom pixel contacts 514 and 516.

The first and second bottom pixel contacts 514 and 516 are respectively connected to first and second pixel electrodes 520 and 522. The first and second pixel electrodes 520 and 522 are each coated by a pixel covering layer, which typically is an n-doped material. The pixel covering layer is formed into first and second n-doped layer portions 524' and 524" respectively over the first and second pixel electrodes 520 and 522. The first and second n-doped layer portions 524' and 524" are each covered by an intrinsic layer, or i-layer 526. The cross section of the i-layer 526 is reduced proximate the first and second n-doped layer portions 524' and 524" by a gap 527, which is horizontally spaced between the first and second electrodes 520 and 522. Above the 526 is a i-layer covering layer, which is typically a p-doped material, formed into a p-doped layer 528.

A transparent contact layer 530 is deposited over the p-doped layer 528 and the top capping layer 510. The transparent contact layer 530 is connected to the pixel control circuitry 504 through a via contact 532 and the plurality of metal interconnects 508.

The first pixel consists of the first pixel electrode 520, the first n-doped layer portion 524', the i-layer 526, and the p-doped layer 528. The second pixel is made up of the second pixel electrode 522, the second n-doped layer portion 524", the i-layer 526, and the p-doped layer 528. The first and second pixels are PIN diodes.

The first and second n-doped layer portions 524' and 524" and the reduced cross-section of the i-layer 526 separate the first and second pixel electrodes 520 and 522. The reduced cross-section of the i-layer 526 increases the resistance between the first and second pixel electrodes 520 and 522 so as to prevent leakage current therebetween.

Figure 6:
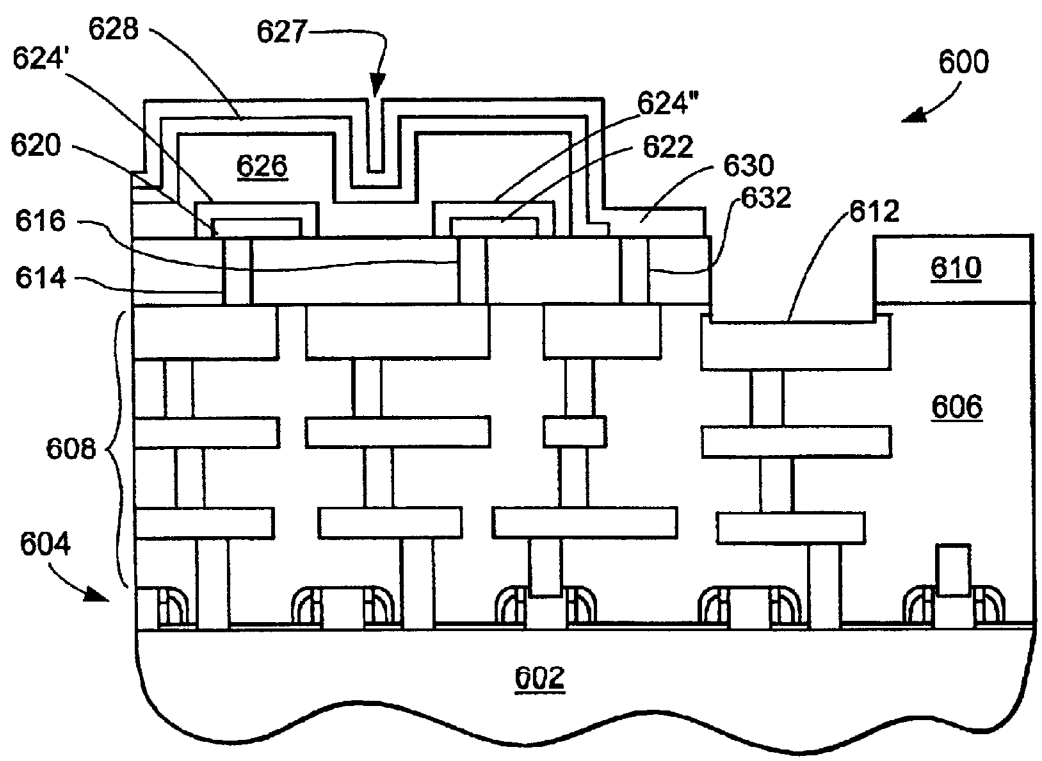
FIG. 6 is a side view of a fifth image sensor in accordance with the present invention.

Referring now to FIG. 6, therein is shown a fifth image sensor 600 according to the present invention. The fifth image sensor 600 includes a semiconductor substrate 602 having a plurality of transistors configured to form pixel control circuitry 604. Above and surrounding the pixel control circuitry 604 are a plurality of layers of dielectric material forming a dielectric layer 606. The dielectric layer 606 contains a plurality of metal interconnects 608.

A top capping layer 610 is disposed above the dielectric layer 606. The top capping layer 610 has an opening provided therein to expose a bonding pad 612 for making an exterior connection to packaging (not shown), which surrounds the fifth image sensor 600. The top capping layer 610 further includes first and second bottom pixel contacts 614 and 616.

The first and second bottom pixel contacts 614 and 616 are respectively connected to first and second pixel electrodes 620 and 622. The first and second pixel electrodes 620 and 622 are each coated by a pixel covering layer, which typically is an n-doped material. The pixel covering layer is formed into first and second n-doped layer portions 624' and 624" respectively over the first and second pixel electrodes 620 and 622. The first and second n-doped layer portions 622' and 624" are each covered by an intrinsic layer, or i-layer 626. The cross section of the i-layer 626 is reduced proximate the first and second n-doped layer portions 624' and 624" by a gap 627, which is horizontally spaced between the first and second electrodes 620 and 622. Above the i-layer 626 is a i-layer covering layer, which is typically a p-doped material, formed into a p-doped layer 628.

A transparent contact layer 630 is deposited over the p-doped layer 628 and the top capping layer 610. The transparent contact layer 630 is connected to the pixel control circuitry 604 through a via contact 632 and the plurality of metal interconnects 608.

The first pixel consists of the first pixel electrode 620, the first n-doped layer portion 624', the first i-layer portion 626', and the p-doped layer 628. The second pixel is made up of the second pixel electrode 622, the second n-doped layer portion 624", the second i-layer portion 626", and the p-doped layer 628. The first and second pixels are PIN diodes.

The gap 627, the first and second n-doped layer portions 624' and 624", the first and second i-layer portions 626' and 626", the p-doped layer 628, and the transparent contact layer 630 separate the first and second pixel electrodes 620 and 622 so as to prevent leakage current therebetween.

Figure 7:
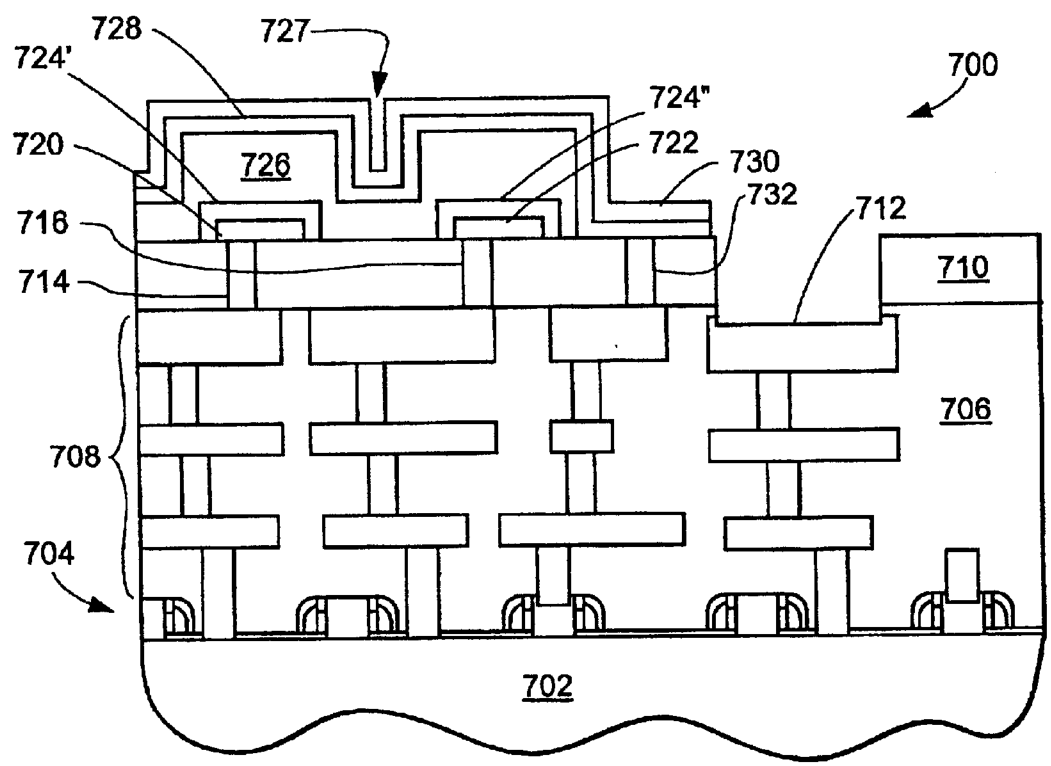
FIG. 7 is a side view of a sixth image sensor in accordance with the present invention.

Referring now to FIG. 7, therein is shown a sixth image sensor 700 according to the present invention. The sixth image sensor 700 includes a semiconductor substrate 702 having a plurality of transistors configured to form pixel control circuitry 704. Above and surrounding the pixel control circuitry 704 are a plurality of layers of dielectric material forming a dielectric layer 706. The dielectric layer 706 contains a plurality of metal interconnects 708.

A top capping layer 710 is disposed above the dielectric layer 706. The top capping layer 710 has an opening provided therein to expose a bonding pad 712 for making an exterior connection to packaging (not shown), which surrounds the sixth image sensor 700. The top capping layer 710 further includes first and second bottom pixel contacts 714 and 716.

The first and second bottom pixel contacts 714 and 716 are respectively connected to first and second pixel electrodes 720 and 722. The first and second pixel electrodes 720 and 722 are each coated by a pixel covering layer, which typically is an n-doped material. The pixel covering layer is formed into first and second n-doped layer portions 724' and 724" respectively over the first and second pixel electrodes 720 and 722. The first and second n-doped layer portions 724' and 724" are each covered by an intrinsic layer, or i-layer 726. The cross section of the i-layer 726 is reduced proximate the first and second n-doped layer portions 724' and 724" by a gap 727, which is horizontally spaced between the first and second electrodes 720 and 722. Above the i-layer 726 is a i-layer covering layer, which is typically a p-doped material, formed into a p-doped layer 728.

A transparent contact layer 730 is deposited over the p-doped layer 728. The transparent contact layer 730 is connected to the pixel control circuitry 704 through the p-doped layer 728, a via contact 732, and the plurality of metal interconnects 708.

The first pixel consists of the first pixel electrode 720, the first n-doped layer portion 724', the first i-layer portion 726', and the p-doped layer 728. The second pixel is made up of the second pixel electrode 722, the second n-doped layer portion 724", the second i-layer portion 726", and the p-doped layer 728. The first and second pixels are PIN diodes.

The gap 727, the first and second n-doped layer portions 724' and 724", the first and second i-layer portions 726' and 726", the p-doped layer 728, and the transparent contact layer 730 separate the first and second pixel electrodes 720 and 722 so as to prevent leakage current therebetween.

The advantage of the third image sensor 700 is that one mask step can be eliminated by leaving the p-doped layer 728 over the via contact 732. Since the p-doped layer 728 is conductive and thin, it will have minimal effect on the performance of the third image sensor 700.

Figure 8:
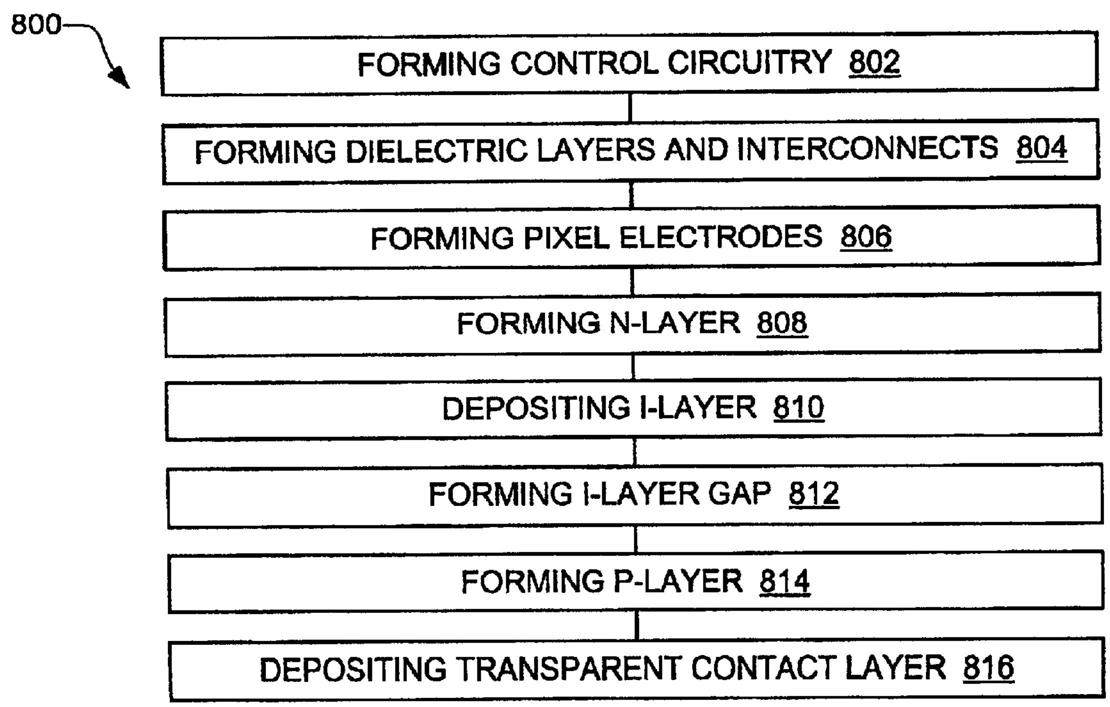
FIG. 8 is a simplified process flow for manufacturing the different image sensors of the present invention.

Referring now to FIG. 8, therein is shown a method 800 for manufacturing the different embodiments of the image sensors of the present invention.

Forming control circuitry 802 includes conventional CMOS processes for forming the transistors for pixel control circuitry on a semiconductor substrate; e.g., forming the pixel control circuitry 204 on the semiconductor substrate 202.

Forming dielectric layers and interconnects 804 involves the processing necessary to form the dielectric layers and interconnects; e.g., forming the dielectric layer 206 and the metal interconnects 208.

Forming pixel electrodes 806 involves the depositing, patterning, and etching of the electrode material and etching to form the first and second pixel electrodes; e.g., forming the pixel electrodes 220 and 222.

Forming n-layer 808 involves the depositing, patterning, and etching of the pixel covering layers or portions; e.g., forming the first and second n-doped layer portions 224' and 224".

Depositing i-layer 810 involves depositing the i-layer over the pixel covering layer or portions; e.g., depositing the i-layer, which subsequently becomes the first and second i-layer portions 226' and 226".

Forming i-layer gap 812 includes the patterning and etching the i-layer to form the gap between the first and second pixel electrodes; e.g., forming the first and second i-layer portions 226' and 226".

Forming p-layer 814 involves the depositing, patterning, and etching of the i-layer covering layers or portions; e.g., forming the first and second p-doped layer portions 228' and 228". In the third image sensor 400, the forming p-layer 814 only involves depositing the p-layer 430.

Depositing the transparent contact layer 816 involves depositing a material such as indium tin oxide (ITO) over the p-layer; e.g., depositing the transparent contact layer 230.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters hither-to-fore set forth herein or shown in the accompanying drawings are to be interpreted in an illustrative and non-limiting sense.

The invention claimed is:

1. A method for manufacturing an image sensor comprising:

providing a substrate;

forming control circuitry on the substrate;

forming dielectric layers on the substrate;

forming interconnects in the dielectric layers in contact with the control circuitry;

forming pixel electrodes in contact with the interconnects;

forming an intrinsic layer (i-layer) over the pixel electrodes;

forming a gap in the i-layer between the pixel electrodes;

forming an i-layer covering layer over the i-layer; and forming a transparent contact layer over the i-layer covering layer and the interconnects.

2. The method as claimed in claim 1 wherein:

forming the gap includes forming the i-layer into first and second i-layer portions.

3. The method as claimed in claim 1 including:

forming a pixel covering layer formed into first and second pixel covering layer portions over the pixel electrodes;

and wherein:

forming the gap includes forming the gap between the first and second pixel covering layer portions.

4. The method as claimed in claim 1 wherein:

forming the gap includes forming the i-layer covering layer into first and second i-layer covering layer portions.

5. The method as claimed in claim 1 wherein:

forming the i-layer covering layer wherein the i-layer covering layer is distal from the interconnects; and forming the transparent contact layer wherein the transparent contact layer is in contact with the interconnects.

6. A method for manufacturing an image sensor comprising:

providing a semiconductor substrate;

forming pixel control circuitry on the substrate;

forming dielectric layers on the substrate;

forming interconnects in the dielectric layers in contact with the pixel control circuitry;

forming pixel electrodes in contact with the interconnects, the pixel electrodes of a material selected from a group consisting of a conductive semiconductor material and a conductive metal;

forming an intrinsic layer (i-layer) over the pixel electrodes;

forming a gap in the i-layer between the pixel electrodes;

forming a i-layer covering layer over the i-layer of a material selected from a group consisting of a p-doped material, an n-doped material, and a transparent conductive material; and forming a transparent contact layer over the i-layer covering layer and the interconnects, the transparent contact layer of a material selected from a group consisting of a transparent conductive material.

7. The method as claimed in claim 6 wherein:

forming the gap includes forming the i-layer into first and second intrinsic layer portions.

8. The method as claimed in claim 6 including:

forming a pixel covering layer formed into first and second pixel covering layer portions over the pixel electrodes, the pixel covering layer of a material selected from a group consisting of an n-doped material and a p-doped material;

and wherein:

forming the gap includes forming the gap between the first and second pixel covering layer portions.

9. The method as claimed in claim 6 wherein:

forming the gap includes forming the i-layer covering layer into first and second i-layer covering layer portions.

10. The method as claimed in claim 6 wherein:

forming the i-layer covering layer wherein the i-layer covering layer is distal from the interconnects; and forming the transparent contact layer wherein the transparent contact layer is over and in contact with the interconnects.

11. An image sensor comprising:

a substrate;

control circuitry on the substrate;

dielectric layers on the substrate;

interconnects in the dielectric layers in contact with the control circuitry;

pixel electrodes in contact with the interconnects;

an intrinsic layer (i-layer) over the pixel electrodes having a gap provided therein between the pixel electrodes;

an i-layer covering layer over the i-layer; and a transparent contact layer over the i-layer covering layer and the interconnects.

12. The image sensor as claimed in claim 11 wherein:

the i-layer includes first and second i-layer portions separated by the gap.

13. The image sensor as claimed in claim 11 including:

a pixel covering layer formed over the pixel electrodes into first and second pixel covering layer portions separated by the gap.

14. The image sensor as claimed in claim 11 wherein:

the i-layer covering layer includes first and second i-layer covering layer portions separated by the gap.

15. The image sensor as claimed in claim 11 wherein:

the i-layer covering layer is distal from the interconnects; and the transparent contact layer is in contact with the interconnects.

16. An image sensor comprising:

a semiconductor substrate;

pixel control circuitry on the substrate;

dielectric layers on the substrate;

interconnects in the dielectric layers in contact with the pixel control circuitry;

pixel electrodes in contact with the interconnects, the pixel electrodes of a material selected from a group consisting of a conductive semiconductor material and a conductive metal;

an intrinsic layer (i-layer) over the pixel electrodes and having a gap provided therein between the pixel electrodes;

a i-layer covering layer over the i-layer of a material selected from a group consisting of a p-doped material, an n-doped material, and a transparent conductive material; and depositing a transparent contact layer over the second layer and the interconnects.

17. The image sensor as claimed in claim 16 wherein:

the i-layer includes first and second i-layer portions separated by the gap.

18. The image sensor as claimed in claim 16 including:

a pixel covering layer formed over the pixel electrodes into first and second pixel covering layer portions separated by the gap, the pixel covering layer of a material selected from a group consisting of an n-doped material and a p-doped material.

19. The image sensor as claimed in claim 16 wherein:

the i-layer covering layer includes first and second i-layer covering layer portions separated by the gap.

20. The image sensor as claimed in claim 16 wherein:

the i-layer covering layer is distal from the interconnects; and the transparent contact layer is over and in contact with the interconnects.

* * * * *